United States Patent [19]

Anderson et al.

[11] Patent Number: 4,924,285

[45] Date of Patent: May 8, 1990

[54] MONOLITHIC MULTICHANNEL DETECTOR AMPLIFIER ARRAYS AND CIRCUIT CHANNELS

[75] Inventors: Gordon W. Anderson, Washington, D.C.; John B. Boos, Springfield, Va.; Harry B. Dietrich, Fairfax, Va.; David I. Ma, Arlington, Va.; Ingham A. G. Mack, Laurel; Nicolas A. Papanicolaou, Silver Spring, both of Md.

[73] Assignee: The United States of America as represented by the Secretary of the Navy, Washington, D.C.

[21] Appl. No.: 262,765

[22] Filed: Oct. 25, 1988

[51] Int. Cl.$^5$ .................................. H01L 27/14
[52] U.S. Cl. ........................ 357/30; 357/45; 357/49
[58] Field of Search .............. 357/30 H, 30 L, 30 PF, 357/30 G, 30 B, 45, 49

[56] References Cited

U.S. PATENT DOCUMENTS 3,881,113  3/1985  Rideout et al. ............... 250/551
4,363,963  12/1982  Ando ............................. 357/30 H
4,381,517  1/1978  Harada .......................... 357/16
4,745,449  11/1981  Chang et al. .................. 357/23.1

OTHER PUBLICATIONS

M. Makiuchi et al., A Monolithic Four-Channel Photoreceiver Integrated on a GaAs Substrate Using Metal-Semiconductor Metal Photodiodes and FET's, IEEE Electron Device Letters, vol. EDL-6, No. 12, Ded. 1985.
Lam et al., Monolithic Integration of GaAs Photoconductors with a Field-Effect Transistor, Electronics Letters, vol. 22, No. 14, p. 753, Jul. 3, 1986.
G. Borsuk et al., Photodetectors for Acousto-Optic Signal Processing, SPIE vol. 639, 1986.

*Primary Examiner*—Martin H. Edlow
*Attorney, Agent, or Firm*—Thomas E. McDonnell; Peter T. Rutkowski

[57] ABSTRACT

An integrated, planar, single-channel, photodetector-amplifier device is disclosed. The single-channel device includes a photodetector layer and an amplifier layer above the photodetector layer. The photodetector layer is low-doped to give a low dark current and is sufficiently thick to give a high quantum efficiency. The amplifier layer is of a smaller thickness and is a more highly doped material than the photodetector layer, to provide an amplifier having high gain. An insulating layer is included between the photodetector and amplifier layers for electrically isolating the photodetector and amplifier layers. The layers are fabricated on a substrate. Isolation regions are also included for electrically laterally isolating a photodetector, amplifier, and other circuit components comprising the single channel device from each other.

An integrated multi-channel photodetector-amplifier array is also disclosed which array comprises a plurality of single-channel photodetector-amplifier devices fabricated on the same substrate with isolation regions created by proton bombardment to electrically laterally isolate the individual circuit channels from each other. The photodetector-amplifier array may be a linear or an area array.

20 Claims, 2 Drawing Sheets terial properties. The isolation regions, which extend from the surface of the amplifier layer down toward the substrate, laterally isolate a photodetector, FET, resistors, and other circuit components comprising the single-channel device from each other.

The foregoing and other aspects will become apparent from the following detailed description of the invention when considered in conjunction with the accompanying drawings. It is to be expressly understood, however, that the drawings are not intended as a limitation of the invention but are for the purpose of illustration only.

DESCRIPTION OF THE PREFERRED EMBODIMENT

Figure 1:
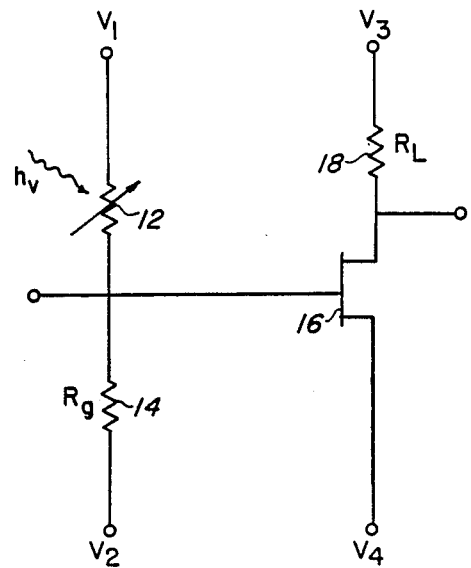
FIG. 1 is a schematic diagram of a single channel photodetector-amplifier circuit.

Referring to FIG. 1 there is shown a schematic diagram of a single channel, photodetector-amplifier circuit. A photodetector 12 is serially connected to a resistor 14. An FET 16 has its gate connected to both the photodetector 12 and a resistor 14. A second resistor 18 is connected between a bias voltage $V_3$ and the FET 16. The FET amplifying stage 16 amplifies a signal generated by the photodetector 12. In the preferred embodiment, the photodetector 12 is a photoconductor, but the photodetector could be any other type of photodetector such as a diode.

Figure 2:
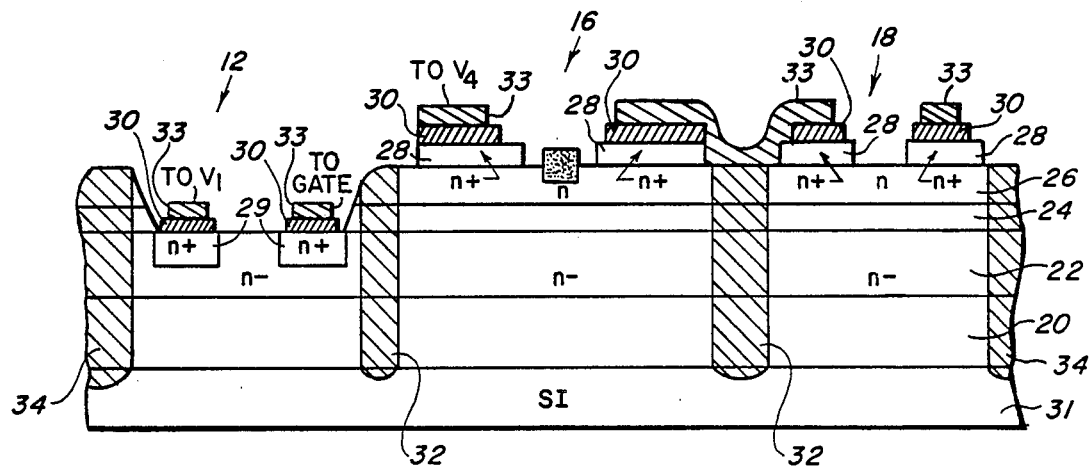
FIG. 2 is a cross-sectional view of the components of a GaAs photodetector- amplifier with an insulating layer in between the photodetector and amplifier layers.

FIG. 2 is an illustration of how to implement the photodetector-amplifier circuit components of FIG. 1 on a semi-conductor chip in integrated form. Monolithic, high-speed, planar, linear, parallel channel, GaAs detector-amplifier arrays, in which the active detector and FET layers with the desired material characteristics, for proper operation, are electrically isolated in the direction perpendicular to the lateral plane of the layers by an insulating layer of AlGaAs, are hereinafter described. In the preferred embodiment, the detector-amplifier arrays are fabricated in a multi-layered molecular beam epitaxial (MBE) GaAs/AlGaAs/GaAs materials system on semi-insulating GaAs substrates as shown in FIG. 2. The photodetector-amplifier array includes a semi-insulating substrate 31, a buffer layer 20, a photodetector layer 22, an insulating layer 24, an FET layer 26, ohmic electrical contacts 30, and overlays 33. Proton bombardment of certain regions 32 is used to laterally isolate the detector region 12 from the FET 16 and resistor regions 14, 18, the FET region 16 from the resistor regions 14, 18 and photodetector region 12, and any one of resistor regions 14, 18 from the FET 16, photodetector 12 and other resistor region. Proton bombardment of other regions 34 is used to isolate the parallel circuit channels from each other. The proton bombardment could also be bombardment by another species such as oxygen. The photodetectors are planar, linear photoconductors with a center-to-center spacing of 70 μm. The regions 32 and 34 of proton bombardment should extend down to the semi-insulating substrate 31 to laterally isolate the detector 12, amplifier 16, and resistor regions 14, 18 from each other and one circuit channel from an adjacent circuit channel. It is preferred that the isolation regions 32, 34 extend from the surface of the amplifier layer 26 down to the substrate 31 for optimum performance. Therefore, the thickness of the buffer layer 20 and detector layer 22 is limited to the extent that isolating regions 32 and 34 do not extend down to the semi-insulating substrate. The buffer layer 20 may be eliminated in order to have a thicker detector layer 22. With current technology, the depth of proton bombardment in regions 32 and 34 is limited to approximately 5 μm. The limiting factor is not the energy of implantation but is the practicality of masking and the number of implants necessary to step all the way down to the substrate. The GaAs buffer layer 20 should be thick enough to minimize defects, e.g. surface roughness, in the semi-insulating substrate from affecting the detector layer. The minimum thickness for the buffer layer is approximately 0.5 μm and the practical upper limit of the buffer layer 20 thickness is 2 μm due to the limitation of the depth of the regions 32 and 34 of proton bombardment. The buffer layer 20 should have a carrier concentration of no higher than $1 \times 10^{14}/cm^3$ in order to minimize leakage paths and not adversely affect photodetector performance. The doping concentration of the buffer layer can be as low as current doping techniques permit. With a molecular beam epitaxial materials system it is difficult to get much lower than $1 \times 10^{14}/cm^3$. The buffer layer 20 could also consist of a superlattice of thin GaAs and AlGaAs layers rather than one thicker GaAs layer. The n⁻ GaAs detector layer 22 is approximately 1 μm thick. This detector layer 22 should preferably have a silicon doping concentration of less than $10^{16}/cm^3$, and the doping concentration may be as low as materials techniques controllably permit, e.g. $2-5 \times 10^{14}$ for GaAs. The doping concentration needs to be low to reduce dark current in the photodetector layer and the layer should be thick enough, e.g. 1 μm to give high quantum efficiency.

The insulating layer 24 between the detector layer 22 and FET layer 26 is undoped AlGaAs. The thickness of the insulating layer 24 can be as low as a few hundred angstroms and as high as 2 μm. In practice, the thickness of the insulating layer 24 is limited in order to minimize possible metal interconnect step coverage problems between the detector contacts and the FET contacts. The electrical connection from the FET gate to the photodetector contact is not shown in FIG. 2. The implementation of resistor 14 is also not shown in FIG. 2. However, it would be done the same as resistor 18.

The FET layer 26, in which the circuit resistors are also fabricated, is n type GaAs with a silicon doping density of approximately $1/1 \times 10^{17}/cm^3$. However, this doping density can be in the range of $10^{16}/cm^3$ to $3 \times 10^{17}/cm^3$. The silicon doping density of the FET layer is higher than the photodetector layer. Higher doping concentrations are necessary to give a high transconductance value for the FET. This high transconductance value (high gain for the FET) allows the photodetector amplifier array to be sensitive to low levels of light. A semi-insulating substrate 31 of GaAs is also included. Although it is desirable for many practical devices that the substrate be semi-insulating, it may be useful in the cases of other practical devices that the substrate not be semi-insulating. For example, in the case of some devices it may be appropriate to use an n⁺ substrate. In the preferred embodiment a 50 nm thick n+ GaAs layer 28 with a silicon doping density of $7.0 \times 10^{18}/cm^3$ is used below the AuGe/Ni/Au ohmic FET and resistor contacts 30 to obtain reduced ohmic contact resistance to the FET layer 26. The n+ regions 29 within the photodetector region 12 were ion implanted with silicon and subsequently annealed for activation. The depth of the silicon implantation, in the n+ regions 29, was in the range of 2500-6000 angstroms, and the doping density was greater than $10^{18}/cm^3$.

A large number of these circuit channels may be fabricated on one chip thereby forming the detector array. These arrays have more detector elements and a smaller detector-center to detector-center spacing than other parallel channel compound semiconductor detector arrays reported to date. The implementation of the resistor 14 in FIG. 1 in an integrated circuit is not illustrated in FIG. 2, however it would be done exactly the same as the load resistor 18. Of course it would be readily apparent to the skilled practitioner to implement other circuit components, e.g. capacitors on the same chip as the photodetector-amplifier circuit channel.

The insulating AlGaAs layer 24 between the FET layer 26 and detector layer 28 (FIG. 2) is very effective in providing electrical isolation between these two active layers. Resistance values between adjacent ohmic contacts, one in the FET layer 26 and one in the detector layer 28 separated by 15 μm in the lateral direction, are in the range of 40-120 M-ohm for photodetector layers with silicon doping concentrations of either $5 \times 10^{14}/cm^3$ or $3 \times 10^{15}/cm^3$.

ALTERNATE EMBODIMENTS

It is clear that the described invention may be extended to other semiconductor materials, to other light wavelengths, and to other types of photodetectors used for optoelectronic circuits. For example, in a first alternate embodiment, the semi-insulating substrate could be made from indium phosphide, the photodetector layer could be a low-doped indium gallium arsenide or low-doped indium phosphide, the insulating layer could be undoped indium aluminum arsenide, and the amplifier layer could be a high-doped indium gallium arsenide or indium phosphide.

In a second alternate embodiment, the semi-insulating substrate could be cadmium telluride, the photodetector layer could be low-doped mercury cadmium telluride, the insulating layer could be undoped cadmium telluride, and the amplifier layer could be high-doped mercury cadmium telluride.

In a third alternate embodiment, a silicon substrate could be substituted for the semi-insulating GaAs substrate in the preferred embodiment. This embodiment would make use of the GaAs on silicon technology.

It would also be apparent to the skilled practitioner to implement more complicated circuitry in the photodetector-amplifier channels. For example, a six or seven stage amplifier could be fabricated in the amplifier layer of the monolithic chip. For an example of more complicated detector-amplifier circuitry, the paper, "A Monolithic Four-Channel Photoreceiver Integrated on a GaAs Substrate Using MSM Photodiodes and FET's", IEEE Electron Device Letters, Vol. EDL-6, No. 12, (Dec. 1985), by M. Makiuchi et al. is herein incorporated by reference.

Figure 3A:
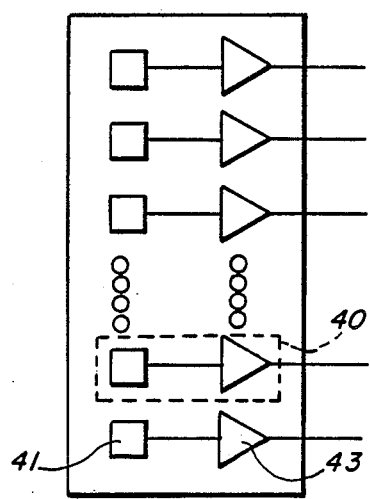
FIG. 3a is a schematic diagram of a parallel addressed detector-amplifier array.

In FIG. 3a a schematic diagram of a parallel-addressed detector-amplifier array is shown. The parallel addressed array is constructed with a plurality of photodetector-amplifier circuit channels 40 which are adjacent to each other on the same semi-conductor chip to form a multi-channel photodetector-amplifier array. Each circuit channel includes a photodetector 41 and amplifier 43. The signals produced by the plurality of photodetector-amplifier circuit channels can be taken off in a parallel fashion as shown.

Figure 3B:
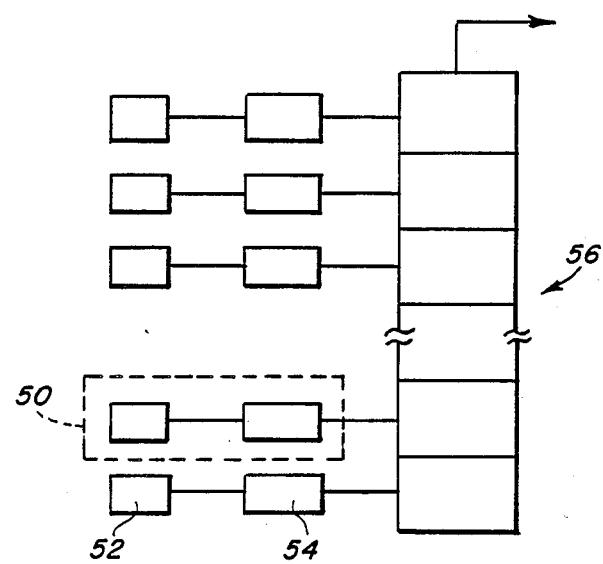
FIG. 3b is a schematic diagram of a serial addressed detector-multiplexer array.

In FIG. 3b there is shown a schematic diagram of a linear detector array having a plurality of adjacent photodetector circuit channels 50. Each circuit channel 50 includes a detector 52 connected to an input circuit 54. An example of an input circuit 54 is described in "Photodetectors For Acousto-Optic Signal Processing", Proc. of Society of Photo-Optical Instrumentation Engineers, V. 639, P. 2 (1986) by G. Anderson et al.. In this case, the signals produced by the photodetector circuit channels 50 are sent to a shift register 56 and taken off in a serial fashion as illustrated. These circuits in FIG. 3a and FIG. 3b can be implemented in a monolithic design as described previously in reference to FIG. 2. In the case of linear detector arrays with a large number of detector elements (from about 50 to several thousand), more than one shift register may be required. The outputs of different sets of detectors are then read out by different shift registers, one set of detectors being read out by each shift register. More complicated architectures are also possible. In addition, area detector arrays may also be implemented in a monolithic design as described.

For more details on the monolithic photodetector-amplifier circuit design, the papers entitled "Planar GaAs Detector-Amplifier Circuits", in Optical Technology for Microwave Applications 111, SPIE Vol. 789, pp. 154-158 (1987) by G. W. Anderson et al. and "Planar, Linear GaAs Detector-Amplifier Array With an Insulating AlGaAs Spacing Layer Between the Detector an Transistor Layers", IEEE Electron Device Letters, Vol. EDL-9, p. 550 (1988) by G. W. Anderson et al. are incorporated herein by reference.

The new method permits routine electrical insulation between photodetectors on the one hand and other circuit components such as transistors and resistors requiring different material properties on the other hand in semiconductor optoelectronic circuits and devices. With the insulating layer between the detector and transistor layers, the effect of the detector layer on transistor and resistor operation is minimized as much as possible. This permits higher levels of integration in optoelectronic circuits. The technique also permits circuit design on the basis of the particular materials selected for the photodetectors and transistors. That is, the effect of the detector layer on transistor operation, for example, is essentialy negligible with this method. Thus modifications of circuit and materials designs do not have to be made after circuit fabrication, and new circuits do not then have to be fabricated due to these unexpected and unknown effects of one active material on components fabricated in a different active material which is electrically very different and which may be but need not be chemically similar. These effects of one active material which is electrically different from and which may be but need not be chemically similar to the other active material in which the affected components are fabricated will occur but cannot quantitatively be anticipated. If the insulating layer is not used, unanticipated effects of one material on the components fabricated in the other material will occur.

Obviously, many other modifications and variations of the present invention are possible in light of the above teachings.

It is therefore understood that within the scope of the appended claims, the invention may be practiced otherwise than as specifically described.

What is claimed as new and is desired to be secured by letters patent of the United States is:

1. An integrated planar single-channel photodetector-amplifier device, comprising:
   a photodetector layer;
   an amplifier layer above said photodetector layer;
   said photodetector layer is low-doped to provide a low-dark current, and is sufficiently thick to provide a high quantum efficiency;
   said amplifier layer is of a smaller thickness and is more highly doped, than the photodetector layer, to provide an amplifier having high gain;
   an insulating layer between said photodetector and amplifier layers for electrically insulating said low-doped photodetector layer from the more highly doped amplifier layer;
   a substrate below said photodetector layer;
   isolation regions, extending from the surface of the amplifier layer down toward the substrate, for electrically, laterally isolating a photodetector, amplifier, and other circuit components comprising the single-channel photodetector-amplifier device from each other; and
   means for making electrical connection from one circuit component to another.

2. The single-channel photodetector-amplifier device of claim 1, further comprising a buffer layer between said photodetector layer and the substrate for minimizing the effects of defects in the substrate on the layers above said substrate.

3. The single-channel photodetector-amplifier device of claim 2 wherein the insulating layer is undoped AlGaAs.

4. The single-channel photodetector-amplifier device of claim 3 wherein the detector layer is n$^-$ type conductivity GaAs and has a silicon doping density of less than $10^{16}$/cm$^3$ and as low as materials techniques controllably permit.

5. The single-channel photodetector-amplifier device of claim 4 wherein the buffer layer is comprised of a GaAs material having a carrier concentration of less than $1 \times 10^{14}$/cm$^3$ and as low as materials techniques controllably permit.

6. The single-channel photodetector-amplifier device of claim 5 wherein the amplifier layer comprises n type GaAs material having a silicon doping density in the range of $10^{16}$ to $3 \times 10^{17}$/cm$^3$ 7. The single-channel photodetector-amplifier device of claim 6 wherein the substrate comprises semi-insulating GaAs material.

8. An integrated planar multi-channel photodetector-amplifier array, comprising:
   a photodetector layer;
   an amplifier layer above said photodetector layer;
   said photodetector layer is low-doped to provide a low-dark current, and is sufficiently thick to provide a high quantum efficiency;
   said amplifier layer is of a smaller thickness and is more highly doped, than the photodetector layer, to provide an amplifier with high gain;
   an insulating layer between said photodetector and amplifier layers for electrically isolating said low-doped photodetector layer from the more highly doped amplifier layer;
   a substrate below said photodetector layer;
   isolation regions, extending from the surface of the amplifier layer down toward the substrate, for electrically, laterally isolating the photodetector, amplifier, and other circuit components comprising a single-channel photodetector-amplifier device from each other and for isolating a plurality of single-channel photodetector-amplifier devices comprising the multi-channel photodetector-amplifier array from each other; and
   means for making electrical connection from one circuit component to another.

9. The integrated planar multi-channel photodetector-amplifier array of claim 8, further comprising a buffer layer between said photodetector layer and the substrate for minimizing the effects of defects in the substrate on the layers above said substrate.

10. The photodetector-amplifier array of claim 9 wherein the insulating layer is undoped AlGaAs.

11. The photodetector-amplifier array of claim 10 wherein the photodetector layer is n$^-$ type conductivity GaAs and has a silicon doping density of less than $10^{16}$/cm$^3$ and as low as materials techniques controllably permit.

12. The photodetector-amplifier array of claim 11 wherein the buffer layer comprises a GaAs material having a carrier concentration of less than $1 \times 10^{14}$/cm$^3$ and as low as materials techniques controllably permit.

13. The photodetector-amplifier array of claim 12 wherein the amplifier layer comprises n type GaAs material having a silicon doping density in the range of $10^{16}$ to $3 \times 10^{17}$/cm$^3$ 14. The photodetector-amplifier array of claim 13 wherein the substrate comprises semi-insulating GaAs material.

15. The single-channel photodetector-amplifier device of claim 1 wherein the substrate is indium phosphide, the photodetector layer is a material selected from the group consisting of indium gallium arsenide and indium phosphide, the insulating layer is undoped indium aluminum arsenide, and the amplifier layer is a material selected from the group consisting of indium gallium arsenide and indium phosphide.

16. The single-channel photodetector-amplifier device of claim 1 wherein the substrate is cadmium telluride, the photodetector layer is mercury cadmium telluride, the insulating layer is undoped cadmium telluride, and the amplifier layer is mercury cadmium telluride.

17. The multi-channel photodetector-amplifier array of claim 8 wherein the substrate is indium phosphide, the photodetector layer is a material selected from the group consisting of indium gallium arsenide and indium phosphide, the insulating layer is undoped indium aluminum arsenide, and the amplifier layer is a material from the group consisting of indium gallium arsenide and indium phosphide.

18. The multi-channel photodetector-amplfifier array of claim 8 wherein the substrate is cadmium telluride, the photodetector layer is mercury cadmium telluride, the insulating layer is undoped cadmium telluride, and the amplifier layer is mercury cadmium telluride.

19. The integrated planar single-channel photodetector-amplifier device of claim 1 wherein the substrate comprises a silicon material.

20. The integrated planar multi-channel photodetector-amplifier array of claim 8 wherein the substrate comprises a silicon material.

* * * * *